(12) United States Patent
Buchen et al.

(10) Patent No.: US 11,189,904 B2
(45) Date of Patent: Nov. 30, 2021

(54) ANTENNA APPARATUS

(71) Applicant: Trellis, Inc., Peachtree Corners, GA (US)

(72) Inventors: Elizabeth Buchen, Peachtree Corners, GA (US); Adam Snow, Peachtree Corners, GA (US)

(73) Assignee: Trellis, Inc., Peachtree Corners, GA (US)

( * ) Notice: Subject to any disclaimer, the term of this patent is extended or adjusted under 35 U.S.C. 154(b) by 0 days.

(21) Appl. No.: 16/722,852

(22) Filed: Dec. 20, 2019

(65) Prior Publication Data

US 2020/0203800 A1 Jun. 25, 2020

Related U.S. Application Data

(60) Provisional application No. 62/782,765, filed on Dec. 20, 2018.

(51) Int. Cl.
*H01Q 1/12* (2006.01)
*H01Q 1/24* (2006.01)
*G01R 29/08* (2006.01)

(52) U.S. Cl.
CPC ....... *H01Q 1/1242* (2013.01); *G01R 29/0871* (2013.01); *H01Q 1/246* (2013.01)

(58) Field of Classification Search
CPC ........ H01Q 1/1242; H01Q 1/246; H01Q 1/20; H01Q 1/241; H01Q 1/42; H01Q 1/38; G01R 29/0871
See application file for complete search history.

(56) References Cited

U.S. PATENT DOCUMENTS

| | | | |
|---|---|---|---|
| 8,457,700 B2* | 6/2013 | Boss | H04B 1/18 455/575.7 |
| 9,225,048 B2* | 12/2015 | Place | H01P 1/08 |
| 9,484,628 B2* | 11/2016 | Petros | H01Q 1/362 |
| 2005/0122250 A1* | 6/2005 | Taylor | G01S 13/937 342/41 |

* cited by examiner

*Primary Examiner* — Seung H Lee
(74) *Attorney, Agent, or Firm* — Troutman Pepper Hamilton Sanders LLP; James E. Schutz; Micah B. Hensley

(57) ABSTRACT

The disclosed technology includes an antenna system having a radio and an antenna disposed proximate a first end of a separate and distinct mast. The mast can include a data transmission cable that can be in electrical communication with the radio and antenna. A microcontroller can be disposed proximate a second end of the mast, and the microcontroller can be in electrical communication with the data transmission cable and can be configured to control operation of the radio.

20 Claims, 8 Drawing Sheets

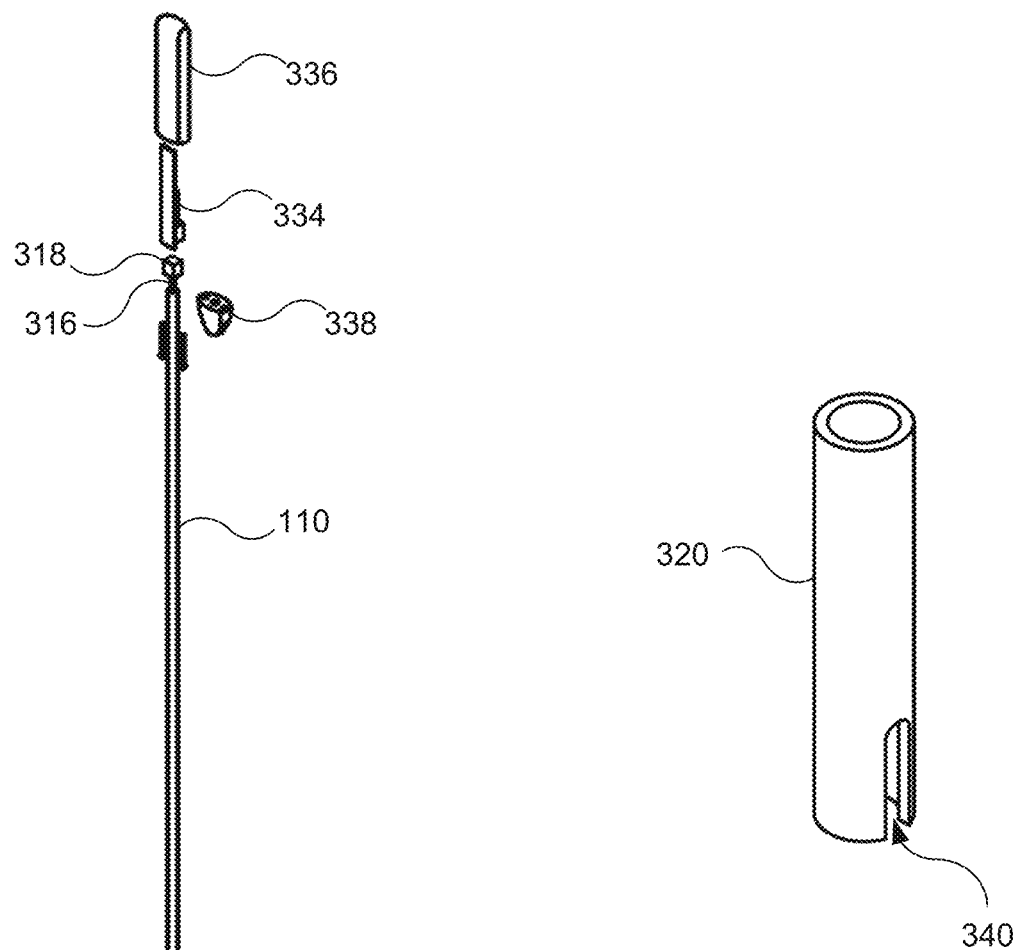
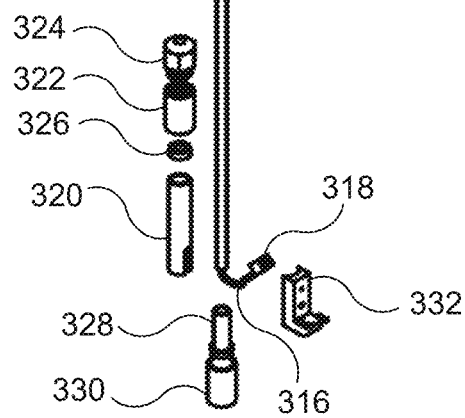
FIG. 3F
FIG. 3G

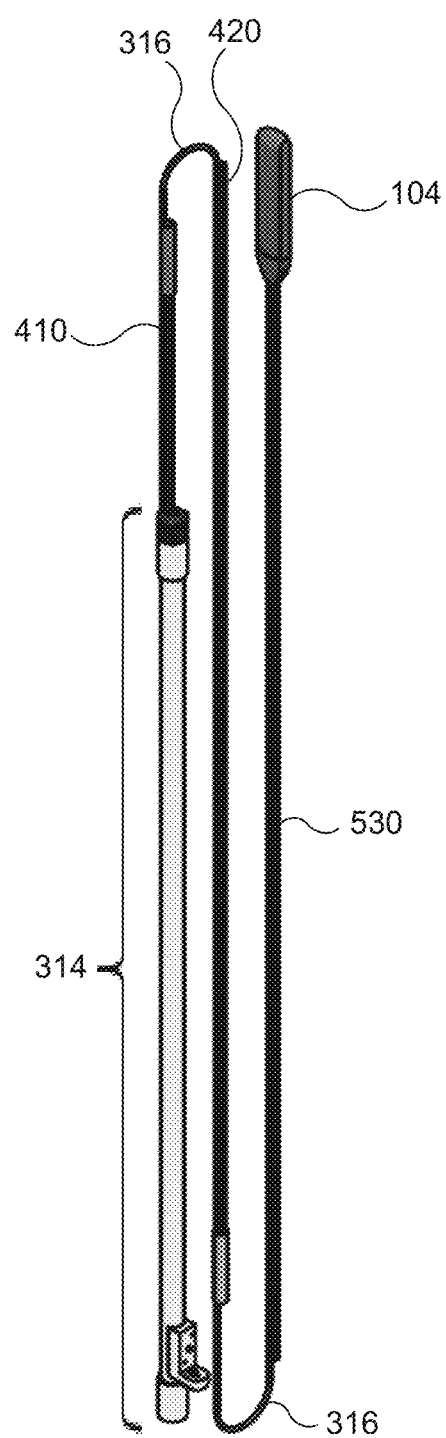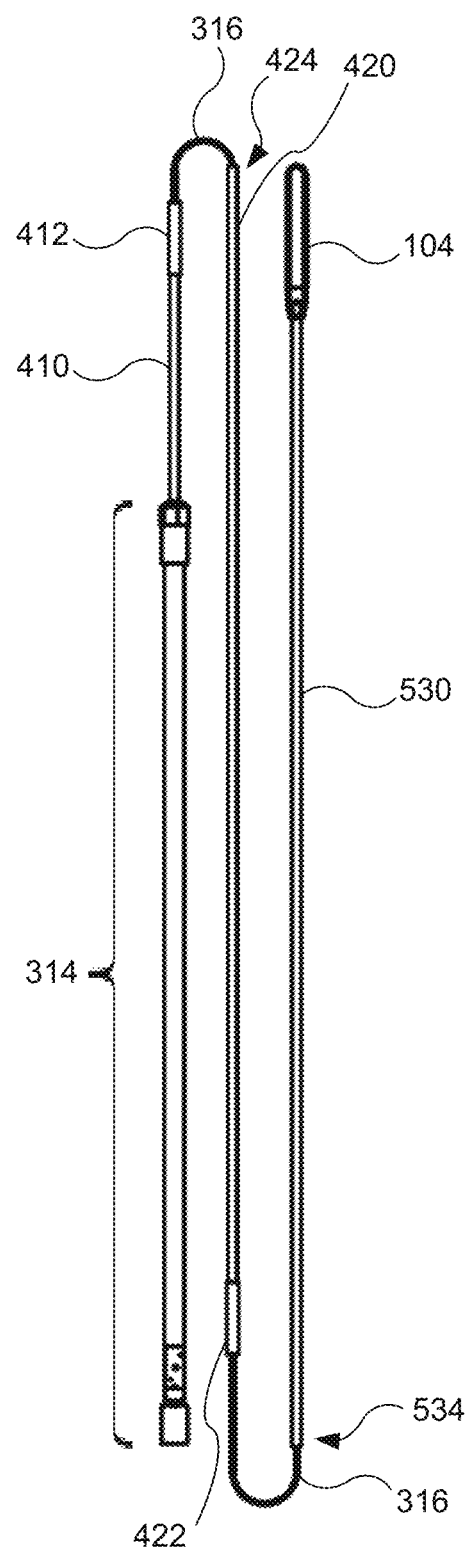
FIG. 5A
FIG. 5B

ANTENNA APPARATUS

CROSS-REFERENCE TO RELATED APPLICATIONS

This application claims the benefit, under 35 U.S.C. § 119(e), of U.S. Provisional Patent Application No. 62/782,765, filed 20 Dec. 2018, the entire contents and substance of which is incorporated herein by reference in its entirety as if fully set forth below.

BACKGROUND

Certain applications require long-range radio transmission. Radio signals, however, can be susceptible to interference from objects, vegetation, terrain, or other obstacles. For example, in agricultural applications, there can often be a need to transmit information from sensors or other equipment across large expanses of land. As crops mature, they can grow to heights that can interrupt or prohibit radio transmissions. To overcome tall obstacles (e.g., crops), existing radio designs sometimes employ a long or tall antenna. But increasing the height or overall length of an antenna transmission line can result in significant energy losses, which can result in decreased output signal strength. To overcome these losses, increased power can be applied to the antenna, but such an increased power requirement may negatively affect other aspects of the radio system. For example, in systems powered by one or more batteries, increased power may result in decreased battery life of the radio system.

SUMMARY

These and other problems may be addressed by embodiments of the technology disclosed herein. Certain embodiments include an antenna system. The antenna system can include a transmitter positioned proximate a top end of a separate and distinct elongate mast. The transmitter can include a radio and a printed circuit board (PCB) trace antenna. A microcontroller can be positioned proximate a bottom end of the elongate mast, and the microcontroller can be electrically connected to the radio via a data transmission cable.

BRIEF DESCRIPTION OF THE FIGURES

Reference will now be made to the accompanying figures, which are not necessarily drawn to scale, and wherein:

FIG. 3F illustrates an exploded isometric view of an antenna system, in accordance with the disclosed technology;

FIG. 3G illustrates an isometric view of a portion of a base of an antenna system, in accordance with the disclosed technology;

FIG. 5A illustrates an isometric view of an antenna system, in accordance with the disclosed technology;

FIG. 5B illustrates a front view of a portion of an antenna system, in accordance with the disclosed technology;

DETAILED DESCRIPTION

Figure 1:
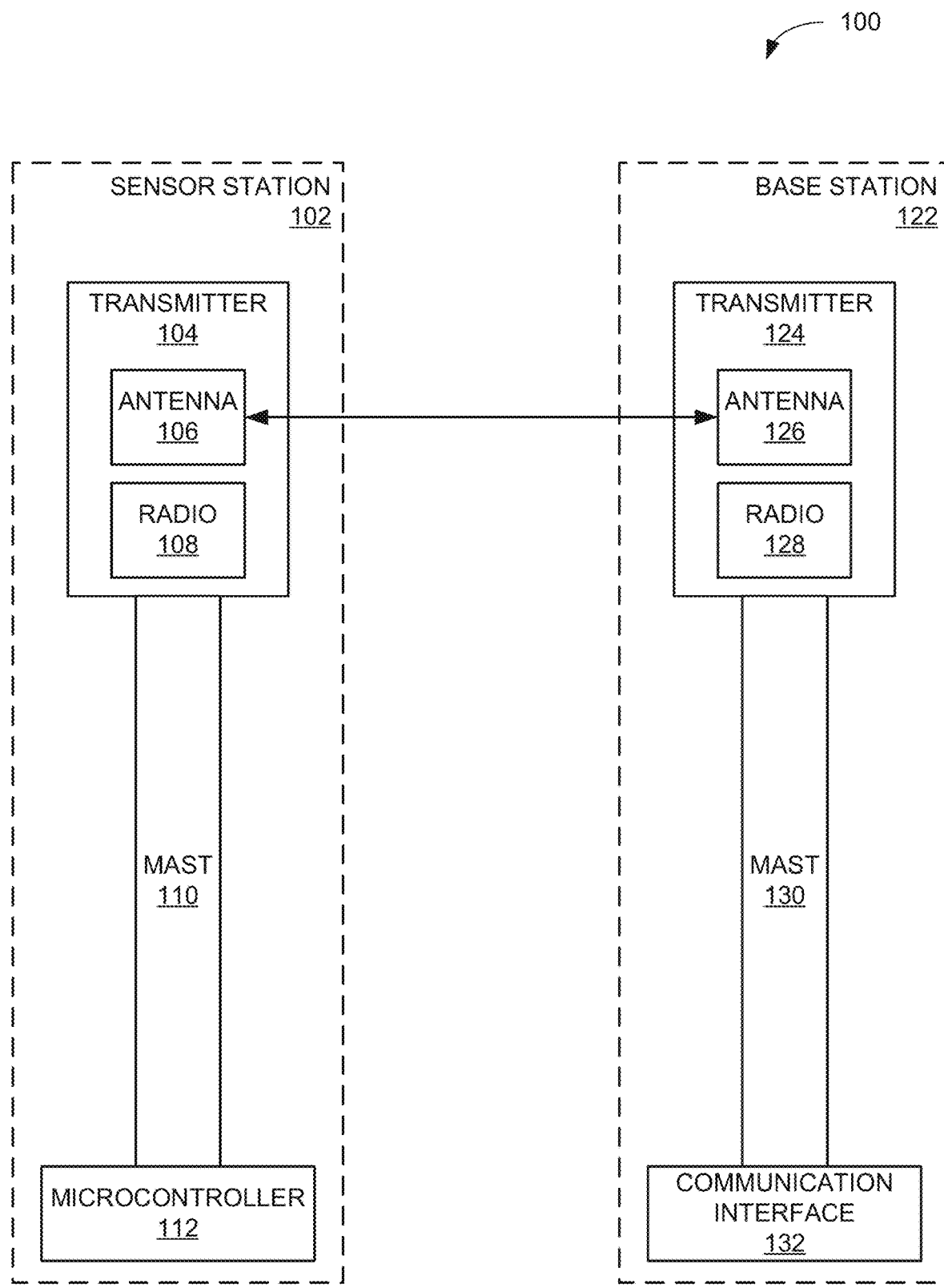
FIG. 1 illustrates a component diagram of an antenna system, in accordance with the disclosed technology.

Throughout this disclosure, certain example embodiments are described in relation to antenna systems including antenna systems having a separate and distinct, elongate mast with a transmitter located at an upper end of the elongate mast. But embodiments of the disclosed technology are not so limited. In some embodiments, the antenna system can include a separate and distinct, multi-piece elongate mast with each piece of the elongate mast configured to mate or otherwise join together with an adjacent piece of the elongate mast. In some embodiments, the transmitter (which can be located at the uppermost end of the elongate mast) can include a radio and an antenna.

Some embodiments of the disclosed technology will be described more fully hereinafter with reference to the accompanying drawings. This disclosed technology may, however, be embodied in many different forms and should not be construed as limited to the embodiments set forth herein. The components described hereinafter as making up various elements of the disclosed technology are intended to be illustrative and not restrictive. Many suitable components that would perform the same or similar functions as components described herein are intended to be embraced within the scope of the disclosed electronic devices and methods. Such other components not described herein may include, but are not limited to, for example, components developed after development of the disclosed technology.

In the following description, numerous specific details are set forth. But it is to be understood that embodiments of the disclosed technology may be practiced without these specific details. In other instances, well-known methods, structures, and techniques have not been shown in detail in order not to obscure an understanding of this description. References to "one embodiment," "an embodiment," "example embodiment," "some embodiments," "certain embodiments," "various embodiments," etc., indicate that the embodiment(s) of the disclosed technology so described may include a particular feature, structure, or characteristic, but not every embodiment necessarily includes the particular feature, structure, or characteristic. Further, repeated use of the phrase "in one embodiment" does not necessarily refer to the same embodiment, although it may.

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

Unless otherwise specified, the use of the ordinal adjectives "first," "second," "third," etc., to describe a common object, merely indicate that different instances of like objects are being referred to, and are not intended to imply that the objects so described should be in a given sequence, either temporally, spatially, in ranking, or in any other manner.

According to some embodiments, the disclosed technology relates to an antenna system. More specifically, the disclosed technology relates to an antenna system having a radio and an antenna disposed atop a separate and distinct mast. Those having skill in the art will recognize that such a configuration has several benefits. For example, certain embodiments of the disclosed technology may be particularly useful for agricultural applications. In agricultural settings, the mast may position the radio and antenna at a height such that the radio and antenna are positioned substantially above a crop canopy or other obstacles that could otherwise (i.e., if the radio and antenna were not positioned atop the mast) interfere with data transmission. As will be described more fully below, some embodiments may include a microcontroller disposed proximate a base end of the mast, and the microcontroller may be in direct electrical communication with the radio via a cable such that the microcontroller and radio can digitally transmit data. Because digital transmission is typically less susceptible to line than conventional radio designs including a long antenna transmission line, the overall signal strength of the presently disclosed technology can be much higher than conventional systems. In some embodiments, this may increase the battery life of the antenna system and/or increase the capable transmission range of the antenna system. Further, while conventional agricultural radio systems may need to be moved throughout the growing season and/or every time a grower uses certain farming equipment, various embodiments of the presently disclosed technology are sufficiently durable and/or have a mast capable of bending out of the way and rebounding to a standing position. These and other advantages will become more apparent in light of the disclosure provided herein.

FIG. 1 illustrates a schematic diagram of an example system that may be configured to transmit and/or receive wireless data signals. The system 100 can include a sensor station 102 and a base station 122. The components and arrangements shown in FIG. 1 are not intended to limit the disclosed embodiments as the components used to implement the disclosed processes and features may vary.

In some embodiments, the sensor station 102 can include a transmitter 104 that can include an antenna 106 and a radio 108. In some embodiments, the antenna 106 and radio 108 may be separate components, while in other embodiments, the antenna 106 and radio 108 may be integral with one another. For example, in some embodiments, the sensor station 102 may include a radio 108 having an integrated trace antenna 106. That is, in certain embodiments, the radio 108 may include an integrated printed circuit board (PCB), and the PCB may include a trace antenna.

Figure 2:
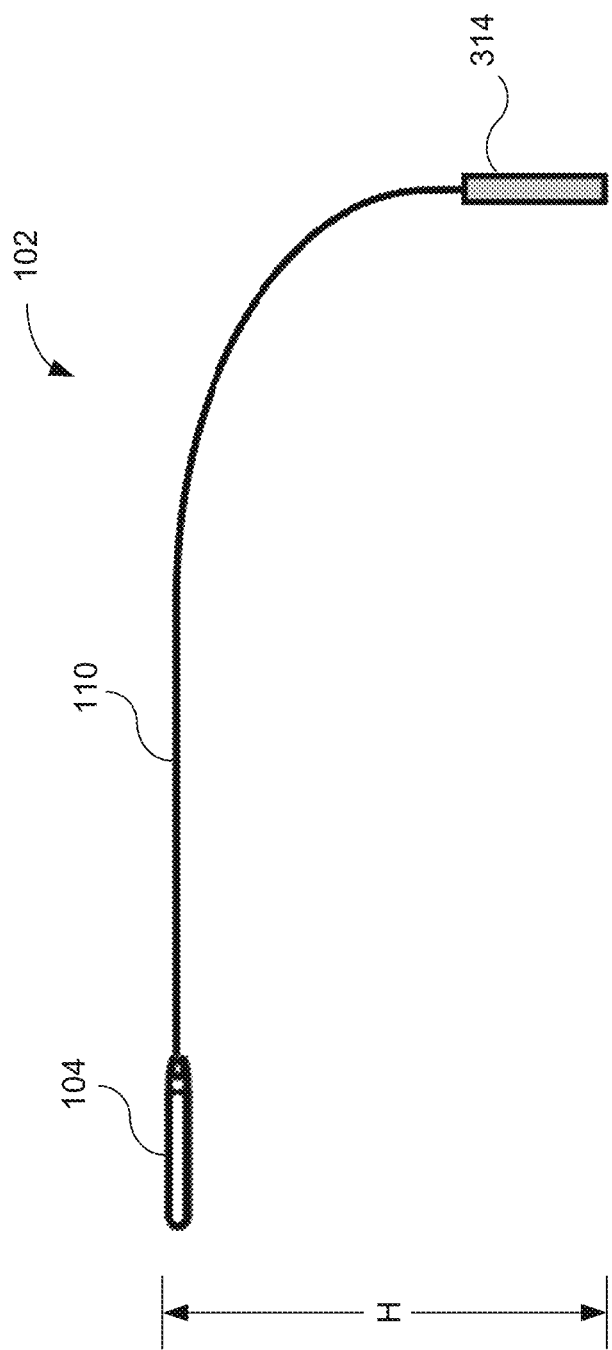
FIG. 2 illustrates a schematic diagram of an antenna system bending, in accordance with the disclosed technology.

In certain embodiments, the transmitter 104 can be positioned atop an elongate mast 110. According to some embodiments, at least some portions of the mast 110 can be made from a flexible material, and in some embodiments, at least some portions of the mast 110 can be made from an electrically insulative material. In certain embodiments, the mast 110 can be at least partially made from fiberglass. In some embodiments, the mast 110 can be made entirely from fiberglass or another flexible, electrically insulative material. In some embodiments, the mast 110 may be configured to bend responsive to being contacted by a rigid structure. Referring to FIG. 2, in some embodiments, the mast 110 may be configured to bend such that, in response to being contacted by a rigid structure having a ground clearance, or height H, of approximately 24 inches, the mast 110 can bend under the rigid structure such that the rigid structure can pass over the mast 110. It should be understood that, in some embodiments, the mast 110 may be configured to bend such that the mast 110 can bend under a rigid structure contacting and passing over the mast 110, where the rigid structure has a ground clearance of approximately 18 inches, approximately 20 inches, approximately 22 inches, approximately 26 inches, approximately 28 inches, approximately 30 inches, approximately 36 inches, or any other height. In some embodiments, the mast 110 can be configured to rebound or snap back to a generally upright or vertical orientation in response to the rigid structure no longer contacting the mast 110. For example, a mast 110 that is anchored proximate the ground and is in a generally upright orientation may be contacted by a tractor or other piece of equipment passing by the mast 110. As the tractor passes over and deflects the mast 110, the mast 110 may bend to a maximum height H of as low as approximately 24 inches (as a non-limiting example) such that the mast 110 is under at least a portion of the tractor as the tractor passes over the mast 110. And as the tractor travels away from the mast 110, the mast 110 may rebound to its original, generally upright orientation. In some embodiments, the mast 110 may be configured to withstand winds in excess of 60 mph, and in some embodiments, the mast 110 may be configured to withstand impact forces of 300 Newtons. In certain embodiments, the mast 110 can be substantially hollow, and in some embodiments, the mast 110 can have an inner diameter sufficiently large to permit a cable (e.g., cable 316, as described below) to fit inside the mast 110. In some embodiments, the mast 110 can be configured to contain a cable running along the full length of the mast 110.

Referring back to FIG. 1, according to some embodiments, a microcontroller 112 can be disposed proximate the end of the mast 110 that is opposite the transmitter 104. Thus, according to some embodiments, the microcontroller 112 can be located proximate a bottom end of the mast 110, and the transmitter 104 can be located proximate a top end of the mast 110. In some embodiments, the microcontroller 112 can be configured to connect to one or more sensors. For example, in some embodiments, the microcontroller 112 may be configured to connect to soil moisture or temperature sensors. In certain embodiments, and the microcontroller 112 can connect to the transmitter 104 by a cable (e.g., cable 316, as described below), and the microcontroller 112 can be configured to control the operation of the transmitter 104. In some embodiments, the microcontroller can be configured to send and/or receive data to or from the transmitter 104. In some embodiments, the microcontroller 112 and the transmitter 104 can communicate with one another using Serial Peripheral Interface (SPI) protocol, and in some embodiments, the SPI protocol can have a 4 MHz clock cycle.

In some embodiments, the microcontroller 112 can be disposed proximate the same end of the mast 110 as the transmitter 104. For example, in some embodiments, the transmitter 104 and the microcontroller 112 can both be disposed proximate a top end of the mast 110. In embodiments in which the microcontroller 112 is disposed proximate the top end of the mast 110, the microcontroller 112 can be in electrical communication with one or more sensors and/or one or more additional microcontrollers 112. The sensor(s) and/or additional microcontroller(s) 112 may be disposed proximate a lowermost end of the mast 110. For example, the microcontroller 112 can be connected to another device (e.g., a sensor, another microcontroller 112) via a data transmission cable disposed within the mast 110.

The microcontroller 112 may include one or more of an application specific integrated circuit (ASIC), programmable logic device, microprocessor, digital signal processor, co-processor or the like or combinations thereof capable of executing stored instructions and operating upon stored data. In some embodiments, the microcontroller 112 may be in communication with memory including stored instructions and/or stored data. The microcontroller 112 may be one or more known processing devices, such as a microprocessor from the AVR™ family manufactured by Microchip Technology™, the Pentium™ family manufactured by Intel™, the Turion™ family manufactured by AMD™, or the Cortex™ family or SecurCore™ manufactured by ARM™. The microcontroller 112 may constitute a single-core or multiple-core processor that executes parallel processes simultaneously. For example, the microcontroller 112 may be a single core processor that is configured with virtual processing technologies. One of ordinary skill in the art should understand that other types of processor arrangements could be implemented that provide for the capabilities disclosed herein.

In certain embodiments, the base station 122 can include a receiver 124 disposed proximate a top end of an elongate mast 130, and the receiver 124 can include an antenna 126 and a radio 128. While some embodiments may be limited to one-way communication between the sensor station 102 and the base station 122, certain embodiments may include a sensor station 102 and base station 122 that are configured to engage in two-way communication with one another. That is, in some embodiments, the sensor station 102 may include both a transmitter 104 and a receiver, the base station 122 may also include both a receiver 124 and a transmitter. In some embodiments, the sensor station 102 and the base station 122 can communicate with one another using LoRa protocol, for example using the LoRa protocol with frequency hopping spread spectrum methods within a range from approximately 902 MHz to approximately 928 MHz (e.g., the 902-928 MHz ISM band). In some embodiments, the communications between the sensor station 102 and the base station 122 may have a bandwidth that is approximately 128 kHz and may have a spreading factor of approximately 256 c/b and/or a coding rate of approximately 4/5. In some embodiments, the communications between the sensor station 102 and the base station 122 may have a bandwidth that is in a range from approximately 62.5 kHz to approximately 500 kHz. In some embodiments, the communications between the sensor station 102 and the base station 122 may have a spreading factor that is in a range from approximately 6 to approximately 12. In some embodiments, the communications between the sensor station 102 and the base station 122 may have a coding rate that is in a range from approximately 4/5 to approximately 4/8 In certain embodiments, the sensor station 102 and the base station 122 can communicate with one another using direct connections such as RF modules, Bluetooth™, Bluetooth™ Low Energy (BLE), WiFi™, ZigBee™, or any other wireless communication methods or protocols. Depending on whether confidentiality is desired, in some embodiments, these connections may be encrypted or otherwise secured.

According to some embodiments, the base station 122 can include a communication interface 132, and in some embodiments, the communication interface 132 may be disposed proximate a bottom end of the mast 130. In certain embodiments, the communication interface 132 may be configured to connect to a wireless network and may include 3G, 4G Long-Term Evolution (LTE), or 5G capabilities or may include capabilities corresponding to any other appropriate communication protocol. For example and not limitation, in some embodiments, the communication interface 132 may be configured to communicate data via an RF module, Bluetooth™, Bluetooth™ Low Energy (BLE), WiFi™, or ZigBee™, or any other wireless communication methods or protocols. It should be understood that in some embodiments, the base station 122 can include some or all of the components and functionalities included in the sensor station 102 and vice versa.

Figure 3A:
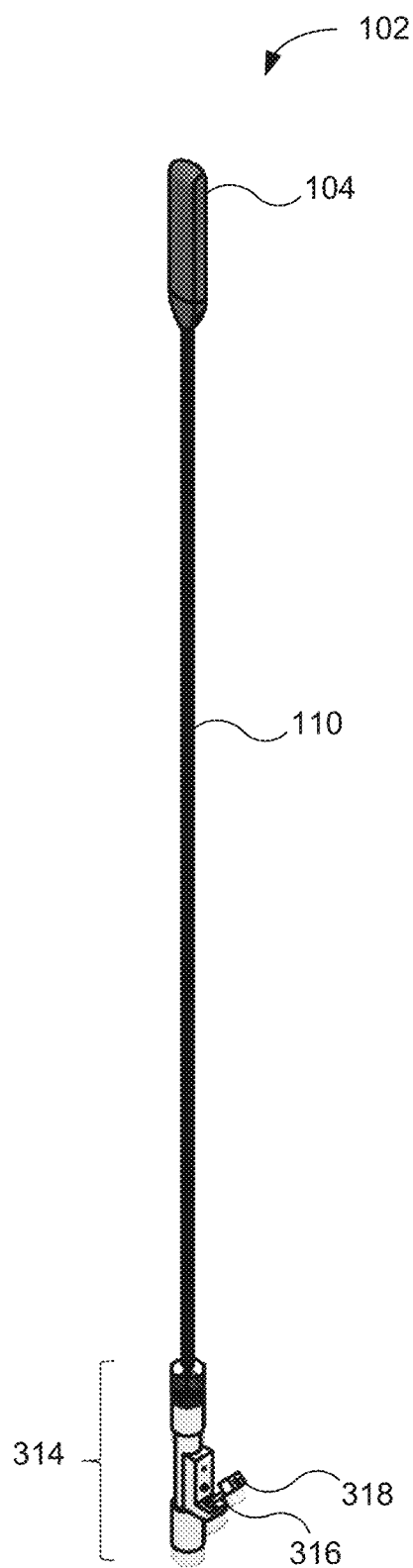
FIG. 3A illustrates an isometric view of an antenna system, in accordance with the disclosed technology.
Figure 3B:
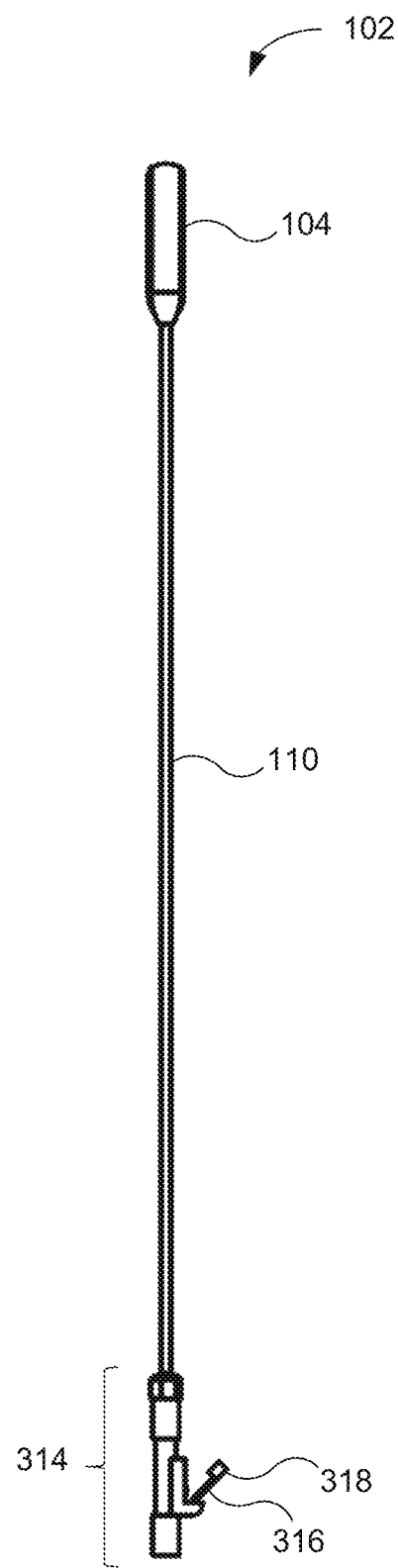
FIG. 3B illustrates a side view of an antenna system, in accordance with the disclosed technology.

Referring to FIGS. 3A and 3B, the sensor station 102 can include a base portion 314, according to some embodiments. The base portion 314 can be configured to attach, connect, or otherwise join to a stationary object, and in some embodiments, the base portion 314 can be configured to attach, connect, or otherwise join to a mobile system (e.g., a tractor or other equipment). In certain embodiments, the base portion 314 can be located such that the sensor station 102 can establish electrical communication with one or more sensors. For example, in some embodiments, the sensor station 102 may include a cable 316 (e.g., CAT3, CAT5, etc.) and a cable connector 318 (e.g., to establish electrical communication with one or more sensors. In some embodiments, the cable 316 and/or cable connector 318 may be configured to connect to the microcontroller 112, and the microcontroller 112 may be in electrical communication with one or more sensors.

Figure 3C:
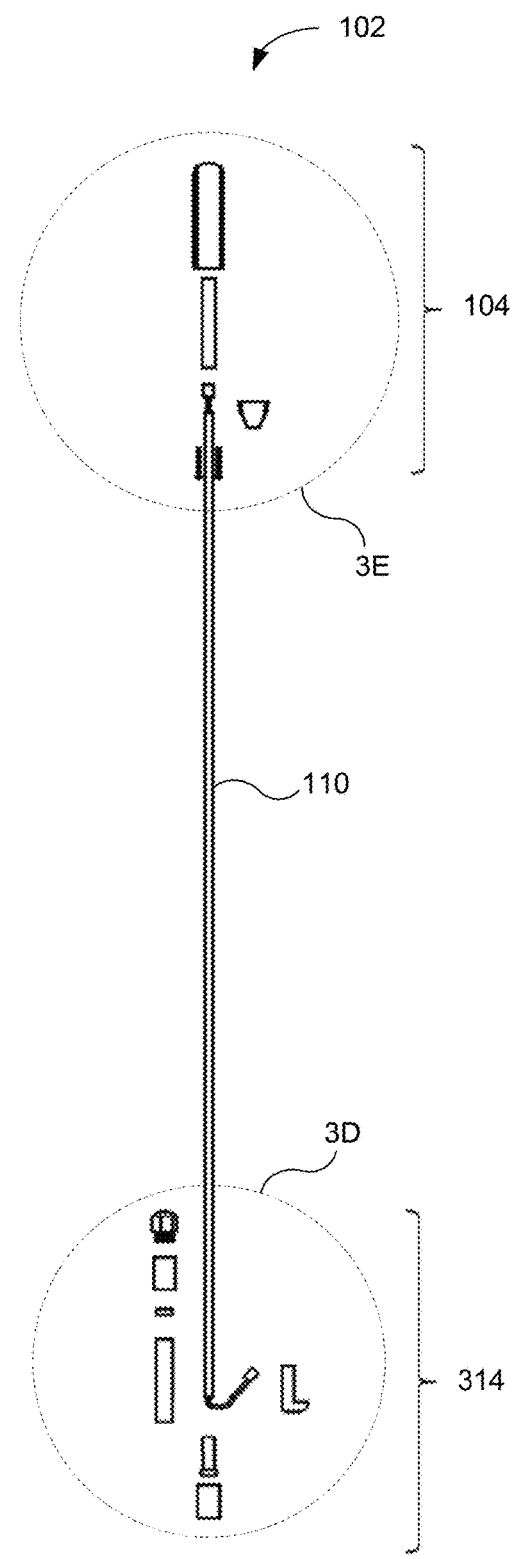
FIG. 3C illustrates an exploded side view of an example system, in accordance with the disclosed technology.
Figure 3E:
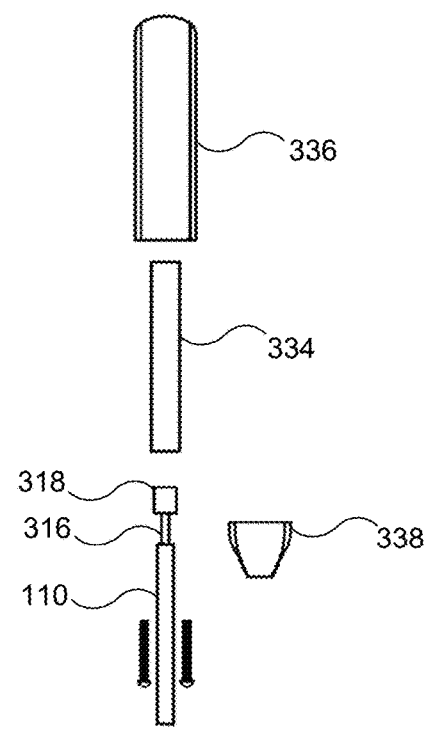
FIG. 3E illustrates a magnified exploded view of a transmitter of an antenna system, in accordance with the disclosed technology.
Figure 3D:
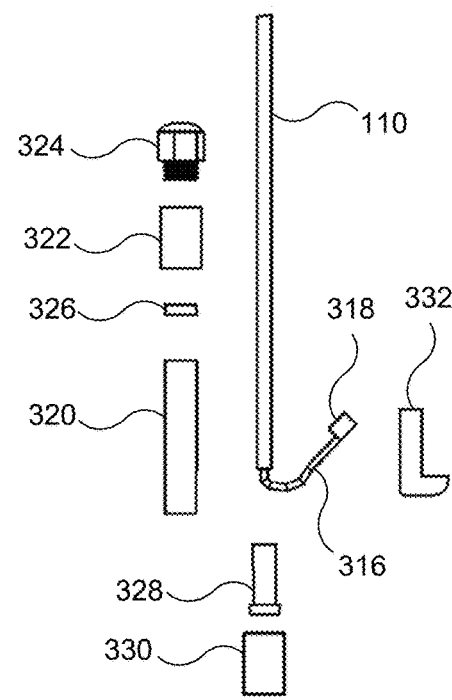
FIG. 3D illustrates a magnified exploded view of a base portion of an antenna system, in accordance with the disclosed technology.

FIGS. 3C-3G depict components that may be included in some embodiments. FIG. 3C includes a callout 3D corresponding to FIG. 3D and callout 3E corresponding to FIG. 3E. As shown in FIG. 3D, the base portion 314 can include a base body 320, and the base body 320 can attach to the mast 110 via an adapter 322 and a cable gland 324. In certain embodiments, a gasket 326 can be positioned between the adapter 322 and the base body 320 to assist in preventing moisture from entering the base portion 314. In some embodiments, a base adapter 328 may be configured to snugly fit inside, snugly fit outside, or otherwise attach to the base body 320, and in some embodiments, the base adapter 328 may connect to a base connection adapter 330. In some embodiments, the base connection adapter 330 may include a thread (male or female) or another connecting mechanism to attach or connect the sensor station 102 to some anchor, device, machine, or other object. A bracket 332 may, in some embodiments, attach or connect to the base body 320. In certain embodiments, the base body 320 can include an aperture 340 (as can be seen most clearly in FIG. 3G), which may permit the cable 316 and cable connector 318 to extend from the mast 110 and out of the base portion 314 via the base body 320. The bracket 332 may also include an aperture through which the cable 316 is permitted to extend such that the cable connector 318 of the cable 316 can connect to the microcontroller 112.

Referring to FIG. 3E, the transmitter 104 can include a radio module 334, and according to some embodiments, the radio module 334 can include the radio 108 and/or the antenna 106. For example, the radio module 334 can be a PCB radio having an integrated trace antenna. In some embodiments, the radio module 334 can be housed inside a housing or enclosure 336. In some embodiments, the enclosure 336 may be configured to connect to an enclosure base 338. In certain embodiments, the enclosure 336 and enclosure base 338 may form a substantially water-resistant or water-proof housing, as desired. In certain embodiments, a gasket may be positioned between the enclosure 336 and enclosure base 338. In some embodiments, the enclosure base 338 may include an aperture configured to permit entry of the cable 316 into the enclosure 336 such that cable connector 318 can connect to the radio module 334. In some embodiments, a gasket may be positioned between the cable 316 and the enclosure base 338 and/or a gasket may be positioned between the mast 110 and the enclosure base 338. In certain embodiments, the enclosure 336 and/or enclosure base 338 may include a UV stabilization additive. In certain embodiments, the enclosure 336 and/or enclosure base 338 may be manufactured by injection molding, additive manufacturing techniques, or any other manufacturing process.

Figure 4A:
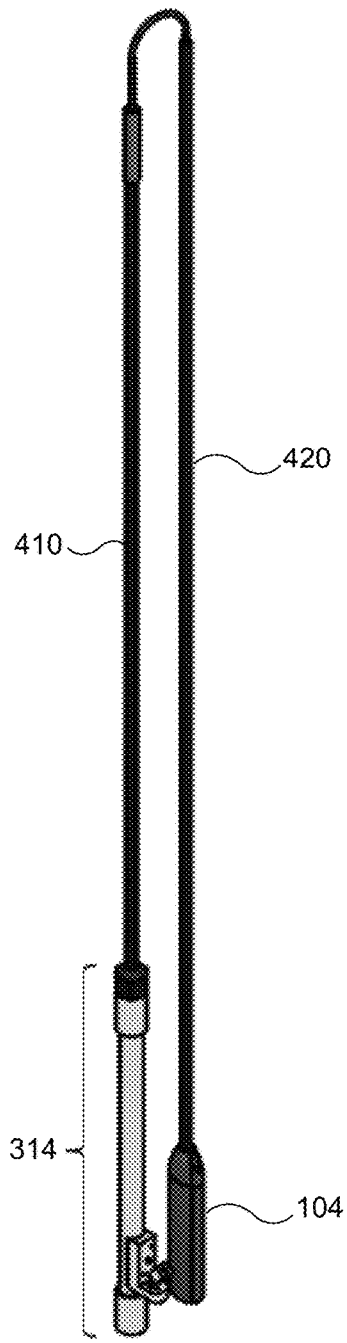
FIG. 4A illustrates an isometric view of an antenna system, in accordance with the disclosed technology.
Figure 4B:
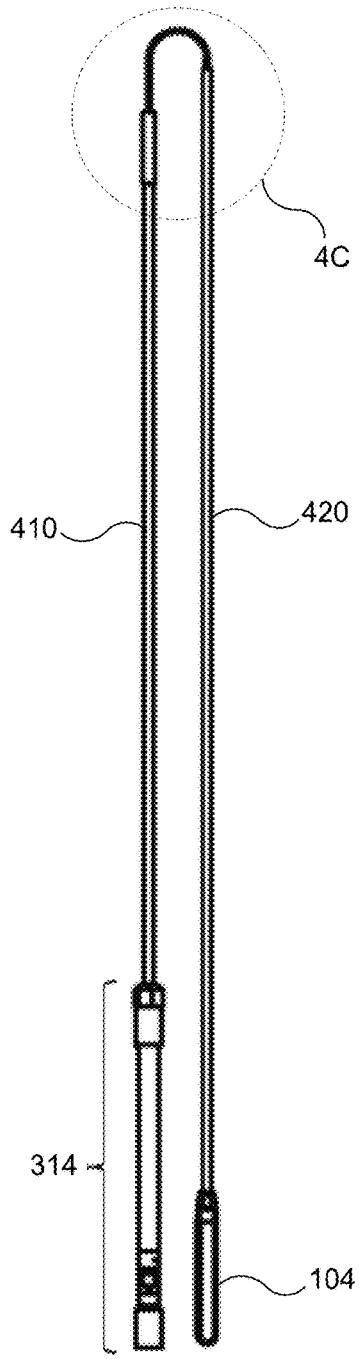
FIG. 4B illustrates a front view of an antenna system, in accordance with the disclosed technology.
Figure 4C:
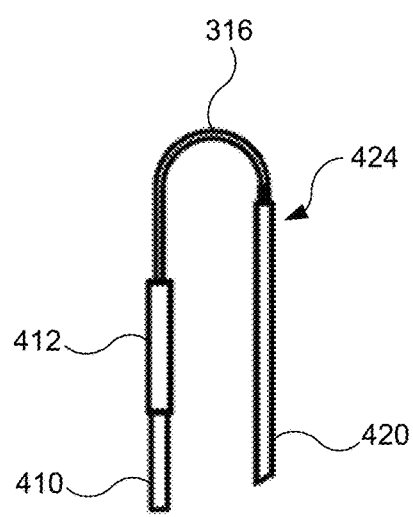
FIG. 4C illustrates a front view of a portion of an antenna system, in accordance with the disclosed technology.

According to some embodiments, the mast 110 having two or more sections. For example, as shown in FIGS. 4A-4C, some embodiments may include a first mast section 410 and a second mast section 420. In some embodiments, the first mast section 410 and second mast section 420 may be configured to detachably attach or connect to one another. In some embodiments, the second mast section 420 may be configured to attach or connect from the first mast section 410 such that the sensor station 102 is in a deployed configuration. In some embodiments, the second mast section 420 may be configured to detach or disconnect from the first mast section 410 such that the sensor station 102 is in a storage configuration. In some embodiments, the enclosure 336 and/or the second mast section 420 may be configured to detachably attach to the bracket 332 or another connection mechanism such that the second mast section 420 is securely stowed when the sensor station 102 is in the storage configuration.

Referring to FIG. 4C, which corresponds to the callout 4C in FIG. 4B, the first mast section 410 may include a female end 412 that is configured to receive a male end 424 of the second mast section 420 such that the second mast section 420 is maintained in a position that is substantially axially aligned with the first mast section 410. In certain embodiments, the female end 412 can comprise a ferrule or hollow tube that is attached to the first mast section 410. In some examples, the ferrule or hollow tube may be made of aluminum. As will be appreciated from FIGS. 4A-4C, when the sensor station 102 is in the storage configuration, a portion of the cable 316 can extend and freely bend between the female end 412 of the first mast section 410 and the male end of the second mast section 412.

Similarly, referring to FIGS. 5A and 5B, some embodiments may include more than two mast sections, such as third mast section 530. In some embodiments, third mast section 530 may include a male end 534 that is configured to insert into and engage a female end 322 of the second mast section 420. In some embodiments, the female end 322 can comprise a ferrule or hollow tube that is attached to the second mast section 420. In some examples, the ferrule or hollow tube may be made of aluminum.

In certain embodiments, the female end 322 or another portion of the second mast section 420 and the male end 534 or another portion of the third mast section 530 can be configured to detachably attach or connect to the bracket 332 or another connection mechanism such that the second mast section is securely stowed when the sensor station 102 is in the storage configuration.

Although certain ends of certain mast portions are referred to as "male" or "female," it should be understood that certain embodiments may have the opposite configuration. For example, according to some embodiments, the first mast portion 410 depicted in FIGS. 4A-4B may include a male end, which may be configured to connect or attach to a female end of second mast portion 420. It should also be appreciated that while certain embodiments may include a male end that slidably inserts into and engages a female end, some embodiments may employ one or more other attachment mechanisms to maintain the mast section in a deployed configuration. For example, some embodiments may include threaded fittings, snap-fit connects, push-button connectors, twist-lock connectors, or any other attachment mechanisms configured to provide detachable attachment between two elongate members.

Figure 6A:
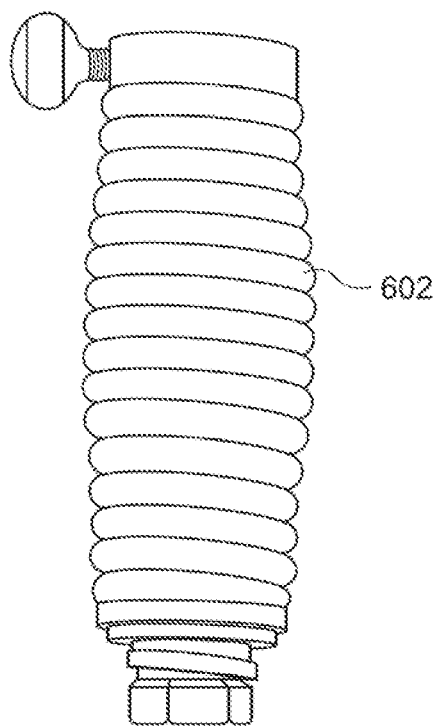
FIG. 6A illustrates a spring for use with an antenna system, in accordance with the disclosed technology.
Figure 6B:
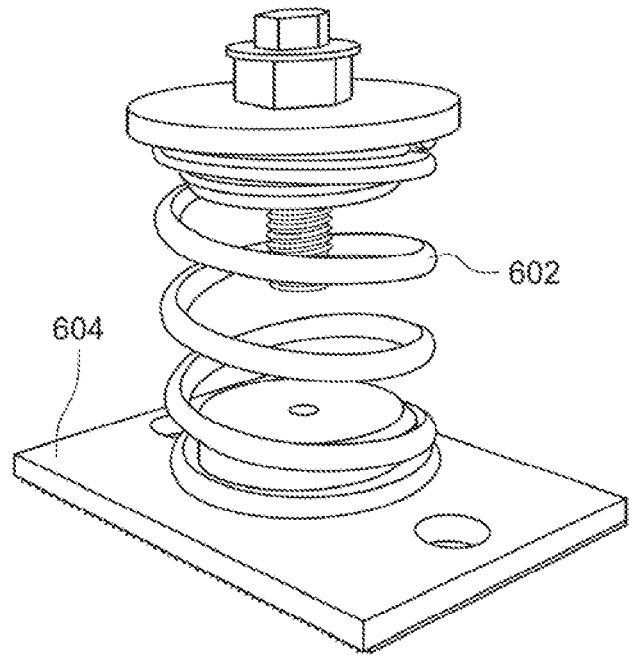
FIG. 6B illustrates a spring for use with an antenna system, in accordance with the disclosed technology.

Referring to FIGS. 6A and 6B, in some embodiments, the sensor station 102 may include a spring 602. According to some embodiments, the spring 602 may be a closed coil spring (e.g., as depicted in FIG. 6A), and in some embodiments, the spring 602 may be an open coil spring (e.g., as depicted in FIG. 6B). In some embodiments, the spring 602 may facilitate bending of the mast 110 and returning the mast 110 to an original, upright position. In some embodiments, the sensor station 102 may include one or more springs 602 in addition to including bending properties of the mast 110, as discussed above. In some embodiments, the spring 602 may be disposed between the base portion 314 and a base plate 604 or other anchor point. In some embodiments the spring 602 may be disposed between the mast 110 and the base portion 314. In some embodiments, a spring may be disposed between adjacent mast sections. Some embodiments may include multiple springs 602 (e.g., a spring 602 between the base portion 314 and the first mast section 410 and a spring 602 between the first mast section 410 and the second mast section 420).

As can be seen from FIGS. 3A-5B, various embodiments of the disclosed technology can be employed to position the transmitter 104 at a predetermined height. In some embodiments, the sensor station 102 may be configured to position the transmitter 104 at a height in the range of 3 feet to 20 feet above the bottom of the base portion 314. For example, according to certain embodiments, the mast 110 (and/or other components, for example, components in the base portion 314) may be dimensioned to position the transmitter 104 at a height of 4 feet (e.g., an embodiment resembling the embodiment shown in FIGS. 3A-3H), 8 feet (e.g., an embodiment resembling the embodiment shown in FIGS. 4A-4C), or 12 feet (e.g., an embodiment resembling the embodiment shown in FIGS. 5A-5B). The height of the mast 110, and thus the height at which the transmitter 104 is positioned, may be determined on a height of environmental obstacles, such as a crop canopy. Accordingly, those of skill in the art will appreciate that height of the mast 110 in various embodiments is not restricted to those heights expressly recited herein, but instead, the mast 110 may have any desired height.

While certain embodiments of the disclosed technology have been described in connection with what is presently considered to be the most practical embodiments, it is to be understood that the disclosed technology is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

What is claimed is:

1. A radio system comprising:
an elongate mast;
a base portion attached to a first end of the elongate mast; and
a radio housing attached to a second end of the elongate mast, the radio housing comprising:
a radio; and
an antenna integral with the radio, the antenna comprising a trace antenna disposed on a printed circuit board.

2. The radio system of claim 1, wherein the elongate mast is hollow and comprises a data transmission cable along a length of the elongate mast, the data transmission cable having a first end in direct electrical communication with the radio.

3. The radio system of claim 2, wherein the data transmission cable is one of a CAT3 cable or a CAT5 cable.

4. The radio system of claim 1, wherein the radio housing is water-proof.

5. The radio system of claim 1, wherein:
the elongate mast has an upright height greater than 24 inches when the elongate mast is in an upright configuration,
the elongate mast is configured to bend from the upright configuration to a bent configuration, the elongate mast having a maximum bend height that is less than 24 inches when the elongate mast is in the bent configuration, and
the upright height and the maximum bend height are each measured with respect to a bottom of the base portion.

6. The radio system of claim 1, wherein the elongate mast comprises an electrically insulating material.

7. The radio system of claim 6, wherein the elongate mast comprises fiberglass.

8. The radio system of claim 7, wherein the elongate mast comprises a plurality of mast sections,
wherein a first mast section of the plurality of mast sections includes a female end and a second mast section of the plurality of mast sections includes a male end, the female end of the first mast section being configured to receive at least part of the male end of the second mast section such that first mast section and second mast section are detachably attachable.

9. The radio system of claim 8, wherein the first mast section and the second mast section are axially aligned when the female end of the first mast section receives at least part of the male end of the second mast section.

10. A radio system comprising:
an elongate mast that is at least partially hollow;
a base portion attached to a first end of the elongate mast;
a radio housing attached to a second end of the elongate mast, the radio housing comprising:
a radio; and
an antenna;
a microcontroller disposed proximate the base portion; and
a data transmission cable located at least partially within the elongate mast, the data transmission cable having a first end in direct electrical communication with the radio and a second end in direct electrical communication with the microcontroller.

11. The radio system of claim 10, wherein the microcontroller is configured to control operation of the radio.

12. The radio system of claim 10, wherein the elongate mast comprises a plurality of mast sections,
wherein a first mast section of the plurality of mast sections includes a female end and a second mast section of the plurality of mast sections includes a male end, the female end of the first mast section being configured to receive at least part of the male end of the second mast section such that first mast section and second mast section are detachably attachable.

13. The radio system of claim 12, wherein the first mast section and the second mast section are axially aligned when the female end of the first mast section receives at least part of the male end of the second mast section.

14. The radio system of claim 10, wherein the elongate mast is hollow and comprises a data transmission cable along a length of the elongate mast, the data transmission cable having a first end in direct electrical communication with the radio.

15. The radio system of claim 14, wherein the data transmission cable has a second end in direct electrical communication with a microcontroller, the microcontroller being disposed proximate the base portion.

16. The radio system of claim 10, wherein the radio housing is water-proof.

17. The radio system of claim 10, wherein:
the elongate mast has an upright height greater than 24 inches when the elongate mast is in an upright configuration,
the elongate mast is configured to bend from the upright configuration to a bent configuration, the elongate mast having a maximum bend height that is less than 24 inches when the elongate mast is in the bent configuration, and
the upright height and the maximum bend height are each measured with respect to a bottom of the base portion.

18. The radio system of claim 10, wherein the elongate mast comprises an electrically insulating material.

19. A radio system comprising:
an elongate mast comprising fiberglass, the elongate mast being tubular and hollow;
an enclosure attached to a first end of the elongate mast, the enclosure being water-proof and housing a printed circuit board having a radio and an antenna;
a data transmission cable disposed within the elongate mast, the data transmission cable having (i) a first end extending from the first end of the elongate mast and into the enclosure and is in electrical communication with the printed circuit board and (ii) a second end extending from a second end of the elongate mast; and
a microcontroller in electrical communication with the second end of the data transmission cable, the microcontroller being configured to control operation of the radio.

20. The radio system of claim 19, wherein the elongate mast comprises a plurality of mast sections,
wherein a first mast section of the plurality of mast sections includes a female end and a second mast section of the plurality of mast sections includes a male end, the female end of the first mast section being configured to receive at least part of the male end of the second mast section such that first mast section and second mast section are detachably attachable.

* * * * *